United States Patent
Kyotani et al.

(10) Patent No.: US 12,297,376 B2
(45) Date of Patent: May 13, 2025

(54) SILICA PARTICLE AND PRODUCTION METHOD THEREFOR, SILICA SOL, POLISHING COMPOSITION, POLISHING METHOD, METHOD FOR PRODUCING SEMICONDUCTOR WAFER AND METHOD FOR PRODUCING SEMICONDUCTOR DEVICE

(71) Applicant: Mitsubishi Chemical Corporation, Tokyo (JP)

(72) Inventors: Tomohiro Kyotani, Tokyo (JP); Eiji Dejima, Tokyo (JP); Naoko Sumitani, Tokyo (JP); Tomohiro Kato, Tokyo (JP); Takeshi Sawai, Tokyo (JP)

(73) Assignee: Mitsubishi Chemical Corporation, Tokyo (JP)

( * ) Notice: Subject to any disclaimer, the term of this patent is extended or adjusted under 35 U.S.C. 154(b) by 818 days.

(21) Appl. No.: 17/406,220

(22) Filed: Aug. 19, 2021

(65) Prior Publication Data

US 2021/0380844 A1 Dec. 9, 2021

Related U.S. Application Data

(63) Continuation of application No. PCT/JP2020/006609, filed on Feb. 19, 2020.

(30) Foreign Application Priority Data

Feb. 21, 2019 (JP) ................. 2019-029141

(51) Int. Cl.
*C09G 1/02* (2006.01)
*H01L 21/304* (2006.01)

(52) U.S. Cl.
CPC .............. *C09G 1/02* (2013.01); *H01L 21/304* (2013.01)

(58) Field of Classification Search
CPC ... C09G 1/02; H01L 21/304; H01L 21/02024; C01B 33/145; C01B 33/148; C01B 33/18; C01B 33/14; C09K 3/1409; C09K 3/1463; B24B 37/00; C01P 2004/64
See application file for complete search history.

(56) References Cited

U.S. PATENT DOCUMENTS

| | | | |
|---|---|---|---|
| 6,338,744 B1 | 1/2002 | Tateyama et al. | |
| 10,058,918 B2 * | 8/2018 | Espinal | C09C 3/12 |
| 2005/0274080 A1 * | 12/2005 | Yoshida | C09G 1/02 |
| | | | 51/308 |
| 2009/0143490 A1 | 6/2009 | Masuda et al. | |
| 2010/0071272 A1 | 3/2010 | Higuchi | |
| 2010/0263574 A1 * | 10/2010 | Gottschalk-Gaudig | C09C 1/3081 |
| | | | 556/466 |
| 2011/0081780 A1 * | 4/2011 | Shida | H01L 21/3212 |
| | | | 438/693 |
| 2011/0163262 A1 | 7/2011 | Higuchi et al. | |
| 2012/0094491 A1 | 4/2012 | Kanamaru et al. | |
| 2014/0363973 A1 | 12/2014 | Kanamaru et al. | |
| 2016/0215170 A1 * | 7/2016 | Tamada | C09G 1/02 |
| 2017/0001870 A1 | 1/2017 | Yoshitake et al. | |
| 2018/0022959 A1 * | 1/2018 | Izawa | H01L 21/7684 |
| | | | 438/693 |
| 2018/0105428 A1 | 4/2018 | Tawarazako et al. | |
| 2018/0155591 A1 | 6/2018 | Kumazawa et al. | |
| 2019/0077994 A1 * | 3/2019 | Park | H01L 21/3212 |

FOREIGN PATENT DOCUMENTS

| | | |
|---|---|---|
| CN | 102449747 A | 5/2012 |
| CN | 105659357 A | 6/2016 |
| CN | 105813977 A | 7/2016 |
| EP | 0373501 A2 * | 6/1990 |
| EP | 3 062 337 A1 | 8/2016 |
| JP | 11-60232 A | 3/1999 |
| JP | 2002-338951 A | 11/2002 |
| JP | 2010-28082 A | 2/2010 |
| JP | 2010-34498 A | 2/2010 |
| JP | 2010-83744 A | 4/2010 |
| JP | 2012-224524 A | 11/2012 |
| JP | 5348400 B2 * | 11/2013 |
| JP | 2018-90798 A | 6/2018 |
| JP | 2018-107293 A | 7/2018 |
| JP | 2018-109074 A | 7/2018 |
| TW | 200848368 A | 12/2008 |
| TW | 201534562 A | 9/2015 |
| WO | WO 2008/015943 A1 | 2/2008 |
| WO | WO 2008/123373 A1 | 10/2008 |
| WO | WO 2009/104465 A1 | 8/2009 |
| WO | WO 2010/035613 A1 | 4/2010 |
| WO | WO 2010/134542 A1 | 11/2010 |

(Continued)

OTHER PUBLICATIONS

JP-5348400-B2, Machine Translation. (Year: 2024).*

(Continued)

*Primary Examiner* — Duy Vu N Deo
*Assistant Examiner* — Christopher Remavege
(74) *Attorney, Agent, or Firm* — Oblon, McClelland, Maier & Neustadt, L.L.P.

(57) ABSTRACT

An object of the present invention is to provide a silica particle having excellent polishing characteristics and storage stability. The present invention relates to a silica particle in which a proportion of silanol groups present on a surface represented by (x/y)×100% is 15% or less, where a content of silanol groups on the surface is x mass % and a content of bulk silanol groups is y mass %.

18 Claims, No Drawings

(56) References Cited

FOREIGN PATENT DOCUMENTS

WO     WO 2015/087965 A1    6/2015
WO     WO 2016/159167 A1    10/2016

OTHER PUBLICATIONS

Combined Chinese Office Action and Search Report issued Apr. 19, 2023, in corresponding Chinese Patent Application No. 202080015562.7(with English Translation and English Translation of Category of Cited Documents), 22 pages.
Extended European Search Report issued Mar. 9, 2022 in European Patent Application No. 20759610.7, 9 pages.
Chinese Office Action issued Sep. 11, 2023 in Chinese Patent Application No. 202080015562.7 (with English Translation), 21 pages.
International Search Report issued Mar. 31, 2020 in PCT/JP2020/006609, filed on Feb. 19, 2020, 2 pages.
Notice of Reasons for Rejection issued Jun. 9, 2021 in corresponding Japanese Application No. 2020-533047, 54 pages (with English translation).
Sugita, "Latest outlook on silica technology—Technology and characteristics of high purity colloidal silica", JETI, vol. 61, No. 3, Mar. 2013, 11 pages (with English translation).
Chinese Office Action issued Feb. 1, 2024 in Chinese Patent Application No. 202080015562.7 (with English translation), 21 pages.

\* cited by examiner

SILICA PARTICLE AND PRODUCTION METHOD THEREFOR, SILICA SOL, POLISHING COMPOSITION, POLISHING METHOD, METHOD FOR PRODUCING SEMICONDUCTOR WAFER AND METHOD FOR PRODUCING SEMICONDUCTOR DEVICE

TECHNICAL FIELD

The present invention relates to a silica particle and a method for producing the same, a silica sol, a polishing composition, a polishing method, a method for producing a semiconductor wafer, and a method for producing a semiconductor device.

BACKGROUND ART

A polishing method using a polishing liquid has been known as a method of polishing a surface of a material such as a metal or an inorganic compound. Among them, in final finish polishing of a prime silicon wafer for a semiconductor or a recycled silicon wafer thereof, and chemical mechanical polishing (CMP) such as planarization of interlayer dielectrics, formation of a metal plug, and formation of an embedded wiring at the time of producing a semiconductor device, since a surface state thereof greatly affects semiconductor characteristics, surfaces and end surfaces of these components are required to be polished with extremely high accuracy.

In such precision polishing, a polishing composition containing silica particles is adopted, and colloidal silica is widely used as abrasive particles which are main components of the polishing composition. Colloidal silica is known to be produced by thermal decomposition of silicon tetrachloride (fumed silica or the like), by deionization of alkali silicate such as water glass, by a hydrolysis reaction and a condensation reaction of alkoxysilane (generally referred to as "a sol-gel method"), or the like due to differences in production method.

With regard to a method for producing colloidal silica, many studies have been made so far. For example, Patent Literatures 1 to 3 disclose a method for producing silica particles by a hydrolysis reaction and a condensation reaction of alkoxysilane. Patent Literature 4 discloses a method for producing silica particles by performing a heat treatment under basic conditions after a hydrolysis reaction and a condensation reaction of alkoxysilane. Patent Literature 5 discloses a method for producing silica particles by performing a heat treatment under acidic conditions after a hydrolysis reaction and a condensation reaction of alkoxysilane.

BACKGROUND ART LITERATURE

Patent Literature

Patent Literature 1: JP-A-H11-60232
Patent Literature 2: WO 2008/123373
Patent Literature 3: WO 2008/015943
Patent Literature 4: JP-A-2010-83744
Patent Literature 5: JP-A-2018-90798

SUMMARY OF INVENTION

Technical Problem

It has been known that silanol groups on a surface of a silica particle and a silanol groups on a surface of a silicon wafer are dehydrated and condensed to form siloxane bonds, as one of polishing mechanisms of a silicon wafer using silica particles. As polishing proceeds by this mechanism, a certain amount of silanol groups is required on the surface of the silica particle. On the other hand, when the silanol groups are excessive, water molecules bonded to the silanol groups by hydrogen bonds form a coating film to cover the surface of the silica particle, and a chance of contact between the silica particle and the silicon wafer is reduced, so that the polishing cannot be performed. Alternatively, when the silanol groups are excessive, siloxane bonds become strong, the silica particles remaining on the surface of the silicon wafer are increased, and quality of the silicon wafer is deteriorated. Further, when the silanol groups are excessive, the silanol groups become reaction active sites, and storage stability is also deteriorated. Thus, a content of the silanol groups present on the surface is also required to be a certain amount or less.

In general, silica particles in a silica sol obtained by a hydrolysis reaction and a condensation reaction of alkoxysilane cannot be said to have a sufficiently high degree of condensation. The reason for this is considered to be that the hydrolysis reaction and the condensation reaction proceed at the same time, and an alkoxy group or a silanol group is likely to remain. Silica particles having a low degree of condensation are insufficient in formation of a membered ring formed by linking $SiO_4$ tetrahedrons, have a small membered ring size, have a large strain, and are inferior in mechanical strength. When such silica particles having a low degree of condensation are used for polishing, there are adverse effects for polishing such as the silica particles are broken during polishing, and the broken silica particles adhere to an object to be polished. Since a large amount of silanol groups remain in the silica particles having a low degree of condensation, the silanol groups remaining during storage serve as reaction active sites, which deteriorates storage stability.

In methods disclosed in Patent Literatures 1 to 3 for producing a silica sol by a hydrolysis reaction and a condensation reaction of alkoxysilane, the obtained silica sol is not subjected to a treatment for increasing a degree of condensation of silica particles, such as a pressurized heat treatment, and it is considered that the obtained silica particles are insufficient in formation of a membered ring, have a large strain, are inferior in mechanical strength and storage stability. The silica particles obtained by methods disclosed in Patent Literatures 4 and 5 are similarly inferior in mechanical strength and storage stability, and a heat treatment under acidic or alkaline conditions may cause aggregation of the silica particles or destruction of a silica skeleton.

The present invention has been made in view of such problems, and an object of the present invention is to provide a silica particle excellent in polishing characteristics and storage stability, a method for producing the same, a silica sol, and a polishing composition. Another object of the present invention is to provide a polishing method, a method for producing a semiconductor wafer, and a method for producing a semiconductor device, which are excellent in productivity of an object to be polished.

Solution to Problem

Silica particles in related art, particularly silica particles obtained by a hydrolysis reaction and a condensation reaction of alkoxysilane, are not always sufficient in polishing characteristics and storage stability. However, as a result of intensive studies, the present inventors have found that polishing characteristics and storage stability of the silica particles are improved by optimizing a proportion of silanol groups present on a surface calculated based on a content of silanol groups on a surface measured by the Sears method and a content of bulk silanol groups measured by a solid $^{29}$Si-DD/MAS-NMR, and have accomplished the present invention.

Namely, the gist of the present invention is described below.

[1] A silica particle in which a proportion of silanol groups present on a surface represented by (x/y)×100% is 15% or less, where a content of the silanol groups on the surface measured by the Sears method is x mass %, and a content of bulk silanol groups measured by a solid $^{29}$Si-DD/MAS-NMR is y mass %.

[2] The silica particle according to [1], wherein the proportion of the silanol groups present on the surface is 10% or less.

[3] The silica particle according to [1] or [2], wherein the proportion of the silanol groups present on the surface is 1% or more.

[4] The silica particle according to any one of [1] to [3], wherein an average primary particle size measured by the BET method is from 10 nm to 60 nm.

[5] The silica particle according to any one of [1] to [4], wherein an average secondary particle size measured by the DLS method is from 20 nm to 100 nm.

[6] The silica particle according to any one of [1] to [5], wherein a content of metal impurity is 5 ppm or less.

[7] The silica particle according to any one of [1] to [6], wherein a tetraalkoxysilane condensate is a main component.

[8] The silica particle according to [7], wherein the tetraalkoxysilane condensate includes a tetramethoxysilane condensate.

[9] A method for producing a silica particle, including subjecting a silica particle to a pressurized heat treatment to obtain the silica particle according to any one of [1] to [8].

[10] A silica sol, including the silica particles according to any one of [1] to [8].

[11] The silica sol according to [10], wherein a content of the silica particles is 3 mass % to 50 mass % with respect to a total amount of the silica sol.

[12] A polishing composition, including the silica sol according to [10] or [11].

[13] A polishing method wherein the polishing composition according to [12] is used for polishing.

[14] A method for producing a semiconductor wafer, including a step of polishing using the polishing composition according to [12].

[15] A method for producing a semiconductor device, including a step of polishing using the polishing composition according to [12].

Effects of Invention

Silica particles according to the present invention, silica particles obtained by a production method according to the present invention, a silica sol according to the present invention, and a polishing composition according to the present invention are excellent in polishing characteristics and storage stability. A polishing method according to the present invention, a method for producing a semiconductor wafer according to the present invention, and a method for producing a semiconductor device according to the present invention are excellent in productivity of an object to be polished.

DESCRIPTION OF EMBODIMENTS

Although the present invention are hereunder specifically described, it should not be construed that the present invention is limited to the following embodiments, and the present invention can be carried out by making various changes within the scope of a gist thereof. In this specification, the expression "to" is used as an expression including numerical values or physical property values before and after the expression.

(Silica Particle)

In silica particles according to the present embodiment, a proportion of silanol groups present on a surface represented by (x/y)×100% is 15% or less, where a content of the silanol groups on the surface measured by the Sears method is x mass % and a content of bulk silanol groups measured by a solid $^{29}$Si-DD/MAS-NMR is y mass %. When the proportion of the silanol groups present on the surface is 15% or less, formation of a membered ring is promoted with sharing oxygen of a $SiO_4$ tetrahedron, a membered ring size becomes large, a strain becomes small, the silica particles are hardly elastically deformed, mechanical strength is excellent, and polishing characteristics of a polishing composition are excellent.

The content of the silanol groups on the surfaces of the silica particles is a value measured by the Sears method. Specifically, measurement is performed under the following conditions.

A silica sol corresponding to 1.5 g of silica particles is collected, and pure water is added thereto to adjust a liquid amount to be 90 mL. A hydrochloric acid aqueous solution of 0.1 mol/L is added until a pH reaches 3.6 in an environment of 25° C., 30 g of sodium chloride is added, the sodium chloride is completely dissolved with gradually adding pure water, and finally, pure water is added until a total amount of a test solution reaches 150 mL to obtain the test solution.

The obtained test solution is placed in an automatic titration device, and a sodium hydroxide aqueous solution of 0.1 mol/L is added dropwise thereto to measure a titration amount A (mL) of the sodium hydroxide aqueous solution of 0.1 mol/L required for the pH to be changed from 4.0 to 9.0.

A consumption amount V (mL) of the sodium hydroxide aqueous solution of 0.1 mol/L required for the pH to be changed from 4.0 to 9.0 per 1.5 g of the silica particles is calculated using the following Formula (1), and a content x (mass %) of the silanol groups on the surfaces of the silica particles is calculated using the following Formula (2).

$$V=(A \times f \times 100 \times 1.5)/(W \times C) \quad (1)$$

A: titration amount (mL) of sodium hydroxide aqueous solution of 0.1 mol/L required for pH to be changed from 4.0 to 9.0 per 1.5 g of silica particles f: titer of used sodium hydroxide aqueous solution of 0.1 mol/L C: concentration (mass %) of silica particles in silica sol W: collection amount (g) of silica sol $$x=(B \times 17/M) \times 100 \quad (2)$$

B: sodium hydroxide amount (mol) required for pH to be changed from 4.0 to 9.0 per 1.5 g of silica particles calculated based on V M: silica particle amount (1.5 g)

A method of measuring and calculating the content of the silanol groups on the surfaces of the silica particles is referred to "G. W. Sears, Jr., Analytical Chemistry, Vol. 28, No. 12, pp. 1981-1983 (1956).", "Shinichi Haba, Development of Polishing Agent for Semiconductor Integrated Circuit Process, Kochi University of Technology Doctoral Dissertation, pp. 39-45, March 2004", "Japanese Patent No. 5967118", and "Japanese Patent No. 6047395".

The content of the silanol groups on the surfaces of the silica particles is preferably 0.01 mass % or more, and more preferably 0.05% mass % or more, and is preferably 1.4% mass % or less, and more preferably 1.0% mass % or less. When the content of the silanol groups on the surfaces of the silica particles is 0.01 mass % or more, the silica particles have appropriate surface repulsion and dispersion stability of the silica sol is excellent. When the content of the silanol groups on the surfaces of the silica particles is 1.4 mass % or less, the silica particles have the appropriate surface repulsion, and aggregation of the silica particles can be prevented.

The content of the bulk silanol groups of the silica particles is a value measured by the solid $^{29}$Si-DD/MAS-NMR. Specifically, measurement is performed under the following conditions.

A silica sol containing the silica particles is freeze-dried to obtain a measurement sample. A nuclear magnetic resonance device of 400 MHz is used, a probe for CP/MAS having a diameter of 7.5 mm is mounted, and measurement is performed by the DD/MAS method with an observation nucleus of $^{29}$Si. As measurement conditions, a $^{29}$Si resonance frequency is 79.43 MHz, a $^{29}$Si90° pulse width is 5 µs, a $^{1}$H resonance frequency is 399.84 MHz, a $^{1}$H decoupling frequency is 50 kHz, an MAS rotation number is 4 kHz, a spectrum width is 30.49 kHz, and a measurement temperature is 23° C. In data analysis, for each peak of a spectrum after Fourier transform, an optimization calculation is performed by a nonlinear least-squares method using a center position, a height, and a half value width of a peak shape created by mixing a Lorentz waveform and a Gaussian waveform as variable parameters. For four structural units Q1, Q2, Q3, and Q4, a content y (mass %) of the bulk silanol groups is calculated using the following formula (3) based on a content of Q1, a content of Q2, a content of Q3, and a content of Q4, which has been obtained.

$$y=\{(\text{content of } Q3\times17+\text{content of } Q2\times17\times2+\text{content of } Q1\times17\times3)/(60+\text{content of } Q3\times1+\text{content of } Q2\times2+\text{content of } Q1\times3)\}\times100 \quad (3)$$

In the present embodiment, the content of the bulk silanol groups of the silica particles is measured by the dipolar decoupling/magic angle spinning (DD/MAS method) rather than the cross polarization/magic angle spinning (CP/MAS method).

In the case of the CP/MAS method, since $^{1}$H sensitizes and detects Si present in the vicinity, and the obtained peak does not accurately reflect the content of Q1, the content of Q2, the content of Q3, and the content of Q4.

On the other hand, since the DD/MAS method has no sensitizing effect as in the CP/MAS method, the obtained peak accurately reflects the content of Q1, the content of Q2, the content of Q3, and the content of Q4, and is suitable for quantitative analysis.

The structural units are classified into Q1 to Q4 according to a degree of coupling of $SiO_4$ tetrahedrons, and are as described below.

Q1 is a structural unit having one Si around Si via oxygen, where the $SiO_4$ tetrahedron is linked to the other one $SiO_4$ tetrahedron, and has a peak in the vicinity of −80 ppm in a solid $^{29}$Si-DD/MAS-NMR spectrum.

Q2 is a structural unit having two Si around Si via oxygen, where the $SiO_4$ tetrahedron is linked to the other two $SiO_4$ tetrahedrons, and has a peak in the vicinity of −91 ppm in the solid $^{29}$Si-DD/MAS-NMR spectrum.

Q3 is a structural unit having three Si around Si via oxygen, where the $SiO_4$ tetrahedron is linked to the other three $SiO_4$ tetrahedrons, and has a peak in the vicinity of −101 ppm in the solid $^{29}$Si-DD/MAS-NMR spectrum.

Q4 is a structural unit having four Si around Si via oxygen, and the $SiO_4$ tetrahedron is linked to the other four $SiO_4$ tetrahedrons, and has a peak in the vicinity of −110 ppm in the solid $^{29}$Si-DD/MAS-NMR spectrum.

The content of the bulk silanol groups of the silica particles is preferably 0.1 mass % or more, and more preferably 0.5 mass % or more, and is preferably 8.0 mass % or less, and more preferably 7.5 mass % or less. When the content of the bulk silanol groups of the silica particles is 0.1 mass % or more, the silica particles can be easily produced. When the content of the bulk silanol groups of the silica particles is 8 mass % or less, the formation of the membered ring is promoted with sharing oxygen of the $SiO_4$ tetrahedron, a membered ring size becomes large, the number of defects is small, the mechanical strength of the silica particles is excellent, and the polishing characteristics of a polishing composition are excellent.

The proportion of the silanol groups present on the surfaces of the silica particles is represented by $(x/y)\times100\%$, where the content of the silanol groups on the surface measured by the Sears method is x mass %, and the content of the bulk silanol groups measured by the solid $^{29}$Si-DD/MAS-NMR is y mass %.

The proportion of the silanol groups present on the surfaces of the silica particles is preferably 1% or more, and more preferably 2% or more due to easy production of the silica particles.

The proportion of the silanol groups present on the surfaces of the silica particles is 15% or less, and preferably 10% or less, since the formation of the membered ring is promoted with maintaining an amorphous structure and sharing oxygen of the $SiO_4$ tetrahedron, the number of defects of the silica particles is small, the mechanical strength of the silica particles is excellent, and the polishing characteristics of the polishing composition are excellent.

The proportion of the silanol groups present on the surfaces of the silica particles can be set to a desired range by adjusting conditions of the hydrolysis reaction and the condensation reaction of alkoxysilane and conditions of a subsequent treatment. Specific examples thereof include a method in which a silica sol obtained by a hydrolysis reaction and a condensation reaction of alkoxysilane is subjected to a pressurized heat treatment; a method in which a hydrolysis reaction and a condensation reaction are separately performed; a method in which a reaction accelerator is added in a hydrolysis reaction and a condensation reaction; etc. Among these methods, the method is preferred in which a silica sol obtained by a hydrolysis reaction and a condensation reaction of alkoxysilane is subjected to a pressurized heat treatment, since the content of the silanol groups on the surfaces of the silica particles and the content of the bulk silanol groups of the silica particles can be easily controlled and the proportion of the silanol groups present on the surfaces of the silica particles can be precisely controlled.

An average primary particle size of the silica particles is preferably 5 nm or more, and more preferably 10 nm or more, and is preferably 100 nm or less, and more preferably 60 nm or less. When the average primary particle size of the silica particles is 5 nm or more, the storage stability of the silica sol is excellent. When the average primary particle size of the silica particles is 100 nm or less, surface roughness and flaws of an object to be polished typified by a silicon wafer can be reduced, and sedimentation of the silica particles can be prevented.

The average primary particle size of the silica particles is measured by the BET method. Specifically, a specific surface area of the silica particles is measured using an automatic specific surface area measurement device, and the average primary particle size is calculated using the following Formula (4).

$$\text{Average primary particle size (nm)} = 6000/(\text{specific surface area (m}^2\text{/g)} \times \text{density (g/cm}^3\text{))} \quad (4)$$

The average primary particle size of the silica particles can be set to a desired range by known conditions and methods.

The average secondary particle size of the silica particles is preferably 10 nm or more, and more preferably 20 nm or more, and is preferably 200 nm or less, and more preferably 100 nm or less. When the average secondary particle size of the silica particles is 10 nm or more, removability of particles and the like in washing after polishing is excellent, and the storage stability of the silica sol is excellent. When the average secondary particle size of the silica particles is 200 nm or less, the surface roughness and the flaws of the object to be polished typified by a silicon wafer during polishing can be reduced, the removability of particles and the like in washing after polishing is excellent, and the sedimentation of the silica particles can be prevented.

The average secondary particle size of the silica particles is measured by the DLS method. Specifically, measurement is performed using a dynamic light scattering particle size measuring device.

The average secondary particle size of the silica particles can be set to a desired range by known conditions and methods.

Coefficient of variation (cv) of the silica particles is preferably 15 or more, more preferably 20 or more, and still more preferably 25 or more, and is preferably 50 or less, more preferably 40 or less, and still more preferably 35 or less. When the cv of the silica particles is 15 or more, a polishing rate for the object to be polished typified by a silicon wafer is excellent, and productivity of the silicon wafer is excellent. When the cv of the silica particles is 50 or less, the surface roughness and the flaws of the object to be polished typified by a silicon wafer during polishing can be reduced, and the removability of particles and the like in washing after polishing is excellent.

The cv of the silica particles is a value calculated by measuring the average secondary particle size of the silica particles using the dynamic light scattering particle size measuring device and using the following Formula (5), and is a value serving as an index of a uniform particle size.

$$cv = (\text{standard deviation (nm)}/\text{average secondary particle size (nm)}) \times 100 \quad (5)$$

An association ratio of the silica particles is preferably 1.0 or more, and more preferably 1.1 or more, and is preferably 4.0 or less, and more preferably 3.0 or less. When the association ratio of the silica particles is 1.0 or more, the polishing rate for the object to be polished typified by a silicon wafer is excellent, and the productivity of the silicon wafer is excellent. When the association ratio of the silica particles is 4.0 or less, the surface roughness and the flaws of the object to be polished typified by a silicon wafer during polishing can be reduced, and the aggregation of the silica particles can be prevented.

The association ratio of the silica particles is calculated using the following Formula (6) based on the average primary particle size measured by the measuring method described above and the average secondary particle size measured by the measuring method described above.

$$\text{Association ratio} = \text{average secondary particle size}/\text{average primary particle size} \quad (6)$$

A content of metal impurity of the silica particles is preferably 5 ppm or less, and more preferably 2 ppm or less. In the present specification, ppm representing the content of the metal impurity means ppm by mass.

In polishing of a silicon wafer of a semiconductor device, the metal impurity adheres to and contaminates a surface of the object to be polished, which adversely affects wafer characteristics, and the metal impurity diffuses into the wafer to deteriorate quality. Therefore, performance of the semiconductor device manufactured by such wafers is significantly reduced.

When the metal impurity is present in the silica particles, a coordination interaction occurs between the silanol groups on the surface exhibiting acidity and the metal impurity, chemical properties (acidity and the like) of the silanol group on the surface are changed, a three-dimensional environment (ease of aggregation of the silica particles and the like) of the surfaces of the silica particles is changed, and the polishing rate is affected.

The content of the metal impurity of the silica particles is measured by inductively coupled plasma mass spectrometry (ICP-MS). Specifically, a silica sol containing 0.4 g of silica particles is accurately weighed, and sulfuric acid and hydrofluoric acid are added thereto. The mixture is heated, dissolved, and evaporated, and pure water is added to the remaining sulfuric acid droplets so that a total amount is accurately 10 g to prepare a test solution. The test solution is measured using an inductively coupled plasma mass spectrometer. A target metal is sodium, potassium, iron, aluminum, calcium, magnesium, zinc, cobalt, chromium, copper, manganese, lead, titanium, silver, or nickel. A total content of these metals is defined as the content of the metal impurity.

The content of the metal impurity of the silica particles may be 5 ppm or less by performing the hydrolysis reaction and the condensation reaction using alkoxysilane as a main raw material to obtain the silica particles.

In a method of deionization of alkali silicate such as water glass, sodium or the like derived from the raw material remains, and thus it is extremely difficult to set the content of metal impurity of the silica particles to 5 ppm or less.

Examples of a shape of the silica particles include a spherical shape, a chain shape, a cocoon shape (also referred to as a bump shape or a peanut shape), an irregular shape (for example, a wart shape, a bent shape, or a branched shape) etc. Among these shapes of the silica particles, in a case where it is desired to reduce the surface roughness or flaws of the object to be polished typified by a silicon wafer during polishing, a spherical shape is preferred, and in a case where it is desired to further increase the polishing rate for the object to be polished typified by a silicon wafer, an irregular shape is preferred.

The silica particles according to the present embodiment preferably have no pores due to the excellent mechanical strength and storage stability.

The presence or absence of pores in the silica particles is confirmed by the BET multipoint analysis using an adsorption isotherm using nitrogen as an adsorption gas.

The silica particles according to the present embodiment preferably contain an alkoxysilane condensate as a main component, and more preferably contain a tetraalkoxysilane condensate as a main component due to the excellent mechanical strength and storage stability. The main component is defined as being 50 mass % or more of total components of the silica particles.

Examples of the tetraalkoxysilane condensate include condensates such as tetramethoxysilane, tetraethoxysilane, tetrapropoxysilane, tetraisopropoxysilane, etc. These tetraalkoxysilane condensates may be used alone or in combination of two or more kinds thereof. Among these tetraalkoxysilane condensates, a tetramethoxysilane condensate and a tetraethoxysilane condensate are preferred, and a tetramethoxysilane condensate is more preferred, since the hydrolysis reaction is fast, an unreacted material hardly remains, productivity is excellent, and a stable silica sol can be easily obtained.

In order to obtain silica particles containing an alkoxysilane condensate as a main component, it is preferable to use alkoxysilane as the main raw material. In order to obtain silica particles containing a tetraalkoxysilane condensate as a main component, it is preferable to use tetraalkoxysilane as the main raw material. The main raw material is defined as being 50 mass % or more of total raw materials of the silica particles.

(Method for Producing Silica Particles)

Examples of a method for producing silica particles include a method by thermal decomposition of silicon tetrachloride, a method by deionization of alkali silicate such as water glass, a method by a hydrolysis reaction and a condensation reaction of alkoxysilane, etc. Among these methods for producing silica particles, a method by a hydrolysis reaction and a condensation reaction of alkoxysilane is preferred and a method by a hydrolysis reaction and a condensation reaction of tetraalkoxysilane is more preferred, since the content of the metal impurity can be reduced and the shape of the silica particles can be easily controlled.

Examples of tetraalkoxysilane include tetramethoxysilane, tetraethoxysilane, tetrapropoxysilane, tetraisopropoxysilane, etc. These tetraalkoxysilanes may be used alone or in combination of two or more kinds thereof. Among these tetraalkoxysilanes, tetramethoxysilane and tetraethoxysilane are preferred, and tetramethoxysilane is more preferred, since the hydrolysis reaction is fast, an unreacted material hardly remains, the productivity is excellent, and the stable silica sol can be easily obtained.

As the raw material of the silica particles, a raw material other than tetraalkoxysilane, such as a low condensation product of tetraalkoxysilane, may be used. Due to excellent reactivity, among the total raw materials of the silica particles, it is preferable that an amount of tetraalkoxysilane is 50% by mass or more and an amount of the raw materials other than tetraalkoxysilane is 50% by mass or less, and it is more preferable that the amount of tetraalkoxysilane is 90% by mass or more and the amount of the raw materials other than tetraalkoxysilane is 10% by mass or less.

Examples of the solvent or dispersion medium used in the hydrolysis reaction and the condensation reaction include water, methanol, ethanol, propanol, isopropanol, ethylene glycol, etc. These solvents or dispersion media may be used alone or in combination of two or more. Among these solvents and dispersion media, water and alcohol are preferred, and water and methanol are more preferred, since those used in the hydrolysis reaction and the condensation reaction are the same as those produced as a by-product, and are excellent in convenience in production.

The hydrolysis reaction and the condensation reaction may be performed in the presence of a catalyst or in the absence of a catalyst. It is preferable in the presence of a catalyst since the hydrolysis reaction and the condensation reaction can be promoted.

Examples of the catalyst include acid catalysts such as hydrochloric acid, sulfuric acid, nitric acid, phosphoric acid, acetic acid, formic acid, citric acid, etc; and alkali catalysts such as ethylenediamine, diethylenetriamine, triethylenetetramine, ammonia, urea, ethanolamine, tetramethyl ammonium hydroxide, etc. Among these catalysts, an alkali catalyst is preferred since catalytic action is excellent and a particle shape is easy to be controlled, and an alkali catalyst is preferred and ammonia is more preferred since mixing of the metal impurity can be prevented, volatility is high, and removability after the condensation reaction is excellent.

In order to increase a degree of condensation of the silica particles, in the method for producing silica particles according to the present embodiment, it is preferable to perform a pressurized heat treatment on the obtained silica particles after completion of the hydrolysis reaction and the condensation reaction of alkoxysilane.

A pressure of the pressurized heat treatment is preferably 0.10 MPa or more, and more preferably 0.14 MPa or more, and is preferably 2.3 MPa or less, and more preferably 1.0 MPa or less. When the pressure of the pressurized heat treatment is 0.10 MPa or more, the degree of condensation of the silica particles can be increased. When the pressure of the pressurized heat treatment is 2.3 MPa or less, the silica particles can be produced without greatly changing the average primary particle size, the average secondary particle size, the cv, and the association ratio, and dispersion stability of the silica sol is excellent.

A temperature of the pressurized heat treatment is preferably 100° C. or more, and more preferably 110° C. or more, and is preferably 220° C. or less, and more preferably 180° C. or less. When the temperature of the pressurized heat treatment is 100° C. or more, the degree of condensation of the silica particles can be increased. When the temperature of the pressurized heat treatment is 220° C. or less, the silica particles can be produced without greatly changing the average primary particle size, the average secondary particle size, the cv, and the association ratio, and the dispersion stability of the silica sol is excellent.

A time of the pressurized heat treatment is preferably 0.25 hours or more, and more preferably 0.5 hours or more, and is preferably 6 hours or less, and more preferably 4 hours or less. When the time of the pressurized heat treatment is 0.25 hours or more, the degree of condensation of the silica particles can be increased. When the time of the pressurized heat treatment is 6 hours or less, the silica particles can be produced without greatly changing the average primary particle size, the average secondary particle size, the cv, and the association ratio, and the dispersion stability of the silica sol is excellent.

The pressurized heat treatment may be performed in air or in a solvent or a dispersion medium, and is preferably performed in a solvent or a dispersion medium since the dispersion stability of the silica sol is excellent, and is more preferably performed in an aqueous dispersion since the proportion of the silanol groups present on the surfaces of the silica particles can be precisely controlled without greatly changing the average primary particle size, the average secondary particle size, the cv, and the association ratio.

The pressurized heat treatment may be performed immediately after the completion of the hydrolysis reaction and the condensation reaction, or may be performed after removing unnecessary components among the components in a reaction liquid after the hydrolysis reaction and the condensation reaction, and adding necessary components. The pressurized heat treatment is preferably performed after removing unnecessary components among the components in the reaction liquid after the hydrolysis reaction and the condensation reaction, and adding necessary components, and more preferably performed after removing an organic compound and adding water, since an operation pressure can be kept low.

When the pressurized heat treatment is performed in an aqueous dispersion, a pH is preferably 6.0 or more, and more preferably 6.5 or more, and is preferably 8.0 or less, and more preferably 7.8 or less. In a case where the pH is 6.0 or more when the pressurized heat treatment is performed in an aqueous dispersion, gelation of the silica sol can be prevented. In a case where the pH is 8.0 or less when the pressurized heat treatment is performed in an aqueous dispersion, structural destruction due to dissolution is prevented, and the proportion of the silanol groups present on the surfaces of the silica particles can be precisely controlled without greatly changing the average primary particle size, the average secondary particle size, the cv, and the association ratio, by which the aggregation of the silica particles can be prevented, and the dispersion stability of the silica sol is excellent.

(Silica Sol)

The silica sol according to the present embodiment preferably contains the silica particles according to the present embodiment and a solvent or a dispersion medium.

Examples of the solvent or dispersion medium of the silica sol include water, methanol, ethanol, propanol, isopropanol, ethylene glycol, etc. These solvents or dispersion media of the silica sol may be used alone or in combination of two or more kinds thereof. Among these solvents or dispersion media of the silica sol, water and alcohol are preferred, and water is more preferred due to excellent affinity with the silica particles.

A content of the silica particles in the silica sol is preferably 3 mass % or more, more preferably 4 mass % or more, and still more preferably 5 mass % or more, and is preferably 50 mass % or less, more preferably 40 mass % or less, and still more preferably 30 mass % or less, with respect to a total amount of the silica sol. When the content of the silica particles in the silica sol is 3 mass % or more, the polishing rate for the object to be polished typified by a silicon wafer is excellent. When the content of the silica particles in the silica sol is 50 mass % or less, the aggregation of the silica particles in the silica sol or the polishing composition can be prevented, and the storage stability of the silica sol or the polishing composition is excellent.

A content of the solvent or the dispersion medium in the silica sol is preferably 50 mass % or more, more preferably 60 mass % or more, and still more preferably 70 mass % or more, and is preferably 97 mass % or less, more preferably 96 mass % or less, and still more preferably 95 mass % or less, with respect to the total amount of the silica sol. When the content of the solvent or the dispersion medium in the silica sol is 50 mass % or more, the aggregation of the silica particles in the silica sol or the polishing composition can be prevented, and the storage stability of the silica sol or the polishing composition is excellent. When the content of the solvent and the dispersion medium in the silica sol is 97 mass % or less, the polishing rate for the object to be polished typified by a silicon wafer is excellent.

The content of the silica particles, the solvent, or the dispersion medium in the silica sol can be set to a desired range by removing unnecessary components from the components in the reaction liquid after the completion of the hydrolysis reaction and the condensation reaction, and adding necessary components.

The silica sol according to the present embodiment may contain, in addition to the silica particles and the solvent or the dispersion medium, other components such as an oxidizing agent, a preservative, an antifungal agent, a pH adjusting agent, a pH buffering agent, a surfactant, a chelating agent, and an antimicrobial and biocide, if necessary, as long as the performance of the silica sol is not impaired.

In particular, it is preferable that the silica sol contains an antimicrobial and biocide due to the excellent storage stability.

Examples of the antimicrobial and biocide include hydrogen peroxide, ammonia, quaternary ammonium hydroxide, quaternary ammonium salt, ethylenediamine, glutaraldehyde, methyl p-hydroxybenzoate, sodium chlorite, etc. These antimicrobial and biocides may be used alone or in combination of two or more kinds thereof. Among these antimicrobial and biocides, hydrogen peroxide is preferred due to the excellent affinity with the silica sol.

The biocide include those generally referred to as bactericides.

A content of the antimicrobial and biocide in the silica sol is preferably 0.0001 mass % or more, and more preferably 0.001 mass % or more, and is preferably 10 mass % or less, and more preferably 1 mass % or less, with respect to the total amount of the silica sol. When the content of the antimicrobial and biocide in the silica sol is 0.0001 mass % or more, the storage stability of the silica sol is excellent. When the content of the antimicrobial and biocide in the silica sol is 10 mass % or less, the original performance of the silica sol is not impaired.

A pH of the silica sol is preferably 6.0 or more, and more preferably 6.5 or more, and is preferably 9.0 or less, and more preferably 7.8 or less. When the pH of the silica sol is 6.0 or more, long-term storage stability of the silica sol is excellent. When the pH of the silica sol is 9.0 or less, the aggregation of the silica particles can be prevented, and the dispersion stability of the silica sol is excellent.

The pH of the silica sol can be set to a desired range by adding a pH adjusting agent.

(Method for Producing Silica Sol)

The silica sol according to the present embodiment may be produced by using a reaction solution after the completion of the hydrolysis reaction and the condensation reaction as it is, or by removing unnecessary components from the components in the reaction solution after the completion of the hydrolysis reaction and the condensation reaction, and adding necessary components.

In production of the silica sol, a filtration step may be included in order to remove coarse particles or avoid aggregation due to fine particles.

Examples of a filtration method include natural filtration under normal pressure, filtration under reduced pressure, filtration under pressure, centrifugal filtration, etc.

Although filtration may be performed at any timing and any number of times, is preferably performed immediately before preparation of the polishing composition due to excellent storage stability and polishing characteristics of the polishing composition.

(Polishing Composition)

The polishing composition according to the present embodiment contains the silica sol according to the present embodiment, and preferably further contains a water-soluble polymer.

The water-soluble polymer enhances wettability of the polishing composition with respect to the object to be polished typified by a silicon wafer. The water-soluble polymer is preferably a polymer having a functional group having high hydrophilicity, affinity between the functional group having high hydrophilicity and the silanol group on the surfaces of the silica particles is high, and the silica particles and the water-soluble polymer are stably dispersed in the vicinity in the polishing composition. Therefore, when polishing the object to be polished typified by a silicon wafer, the effects of the silica particles and the water-soluble polymer synergistically function.

Examples of the water-soluble polymer include a cellulose derivative, polyvinyl alcohol, polyvinylpyrrolidone, a copolymer having a polyvinylpyrrolidone skeleton, a polymer having a polyoxyalkylene structure, etc.

Examples of the cellulose derivative include hydroxyethyl cellulose, hydroxyethylcellulose which has been subjected to a hydrolysis treatment, hydroxypropyl cellulose, hydroxyethylmethyl cellulose, hydroxypropylmethyl cellulose, methyl cellulose, ethyl cellulose, ethylhydroxyethyl cellulose, carboxymethyl cellulose, etc.

Examples of the copolymer having a polyvinylpyrrolidone skeleton include graft copolymers of polyvinyl alcohol and polyvinylpyrrolidone, etc.

Examples of the polymer having a polyoxyalkylene structure include polyoxyethylene, polyoxypropylene, a copolymer of ethylene oxide and propylene oxide, etc.

These water-soluble polymers may be used alone or in combination of two or more kinds thereof. Among these water-soluble polymers, cellulose derivatives are preferred, and hydroxyethyl cellulose is more preferred, since the affinity with the silanol groups on the surfaces of the silica particles is high and good hydrophilicity to the surface of the object to be polished is imparted by synergetic action.

A mass average molecular weight of the water-soluble polymer is preferably 1000 or more, more preferably 5000 or more, and still more preferably 10000 or more, and is preferably 3000000 or less, more preferably 2000000 or less, and still more preferably 1000000 or less. When the mass average molecular weight of the water-soluble polymer is 1000 or more, hydrophilicity of the polishing composition is improved. When the mass average molecular weight of the water-soluble polymer is 3000000 or less, the affinity with the silica sol is excellent, and the polishing rate for the object to be polished typified by a silicon wafer is excellent.

The mass average molecular weight of the water-soluble polymer is measured by size exclusion chromatography under conditions that a NaCl solution of 0.1 mol/L in terms of polyethylene oxide is used as a mobile phase.

A content of the water-soluble polymer in the polishing composition is preferably 0.02 mass % or more, and more preferably 0.05 mass % or more, and is preferably 10 mass % or less, and more preferably 5 mass % or less, with respect to the total amount of the polishing composition. When the content of the water-soluble polymer in the polishing composition is 0.02 mass % or more, the hydrophilicity of the polishing composition is improved. When the content of the water-soluble polymer in the polishing composition is 10% by mass or less, the aggregation of the silica particles during preparation of the polishing composition can be prevented.

The polishing composition according to the present embodiment may contain, in addition to the silica sol and the water-soluble polymer, other components such as a basic compound, a polishing accelerator, a surfactant, a hydrophilic compound, a preservative, an antifungal agent, a pH adjusting agent, a pH buffer, a surfactant, a chelating agent, and an antimicrobial and biocide, if necessary, as long as the performance of the polishing composition is not impaired.

In particular, the basic compound is preferably contained in the polishing composition since chemical polishing (chemical etching) can be performed by imparting a chemical action to the surface of the object to be polished typified by a silicon wafer, and the polishing rate for the object to be polished typified by a silicon wafer can be improved by a synergistic effect with the silanol groups on the surfaces of the silica particles.

Examples of the basic compound include an organic basic compound, an alkali metal hydroxide, an alkali metal hydrogen carbonate, an alkali metal carbonate, ammonia, etc. These basic compounds may be used alone or in combination of two or more kinds thereof. Among these basic compounds, ammonia, tetramethylammonium hydroxide, tetraethylammonium hydroxide, ammonium hydrogen carbonate, and ammonium carbonate are preferred, ammonia, tetramethylammonium hydroxide, and tetraethylammonium hydroxide are more preferred, and ammonia is still more preferred, since water solubility is high and affinity between the silica particles and the water-soluble polymers is excellent.

A content of the basic compound in the polishing composition is preferably 0.001 mass % or more, and more preferably 0.01 mass % or more, and is preferably 5 mass % or less, and more preferably 3 mass % or less, with respect to the total amount of the polishing composition. When the content of the basic compound in the polishing composition is 0.001 mass % or more, the polishing rate for the object to be polished typified by a silicon wafer can be improved. When the content of the basic compound in the polishing composition is 5 mass % or less, the stability of the polishing composition is excellent.

A pH of the polishing composition is preferably 8.0 or more, and more preferably 9.0 or more, and is preferably 12.0 or less, and more preferably 11.0 or less. When the pH of the polishing composition is 8.0 or more, the aggregation of the silica particles in the polishing composition can be prevented, and the dispersion stability of the polishing composition is excellent. When the pH of the polishing composition is 12.0 or less, dissolution of the silica particles can be suppressed, and the stability of the polishing composition is excellent.

The pH of the polishing composition can be set to a desired range by adding the pH adjusting agent.

The polishing composition according to the present embodiment can be obtained by mixing the silica sol according to the present embodiment and, if necessary, a water-soluble polymer and other components. Considering storage and transportation, the polishing composition may be prepared at a high concentration once and diluted with water or the like immediately before polishing.

(Use)

The silica particles according to the present embodiment, the silica particles obtained by the production method according to the present embodiment, the silica sol according to the present embodiment, and the polishing composition according to the present embodiment can be suitably used for polishing applications, for example, can be used for polishing of a semiconductor material such as a silicon wafer, polishing of an electronic material such as a hard disk substrate, polishing (chemical mechanical polishing) in a planarization step in manufacturing an integrated circuit, polishing of a synthetic quartz glass substrate used for a photomask or liquid crystal, polishing of a magnetic disk substrate, and the like, and among them, can be particularly suitably used for polishing or chemical mechanical polishing of a silicon wafer.

(Polishing Method)

A polishing method according to the present embodiment is preferably a method of polishing using the polishing composition according to the present embodiment.

Specific examples of the polishing method include a method in which a surface of a silicon wafer is pressed against a polishing pad, the polishing composition according to the present embodiment is dropped onto the polishing pad, and the surface of the silicon wafer is polished.

(Method for Producing Semiconductor Wafer)

A method for producing a semiconductor wafer according to the present embodiment is a method including a step of polishing using the polishing composition according to the present embodiment, and a specific polishing method is as described above.

Examples of the semiconductor wafer include a silicon wafer, a compound semiconductor wafer, etc.

(Method for Producing Semiconductor Device)

A method for producing a semiconductor device according to the present embodiment is a method including a step of polishing using the polishing composition according to the present embodiment, and a specific polishing method is as described above.

EXAMPLES

Hereinafter, the present invention will be described more specifically with reference to Examples. However, the present invention is not limited to the description of the following Examples as long as its gist is observed.

(Measurement of Average Primary Particle Size)

A silica sol containing silica particles obtained in Examples and Comparative Examples was freeze-dried, and a specific surface area of the silica particles was measured using an automatic specific surface area measurement device "FlowSorb II" (model name, manufactured by Shimadzu Corporation). Using the following Formula (4) and setting a density to 2.2 g/cm$^3$, an average primary particle size was calculated.

$$\text{Average primary particle size (nm)}=6000/(\text{specific surface area (m}^2/\text{g)} \times \text{density (g/cm}^3)) \quad (4)$$

(Measurement of Average Secondary Particle Size and cv)

For the silica sol containing the silica particles obtained in Examples and Comparative Examples, the average secondary particle size of the silica particles was measured using a dynamic light scattering particle size measuring device "Zeeter sizer Nano ZS" (model name, manufactured by Malvern Instruments Ltd.), and coefficient of variation (cv) was calculated using the following Formula (5).

$$cv=(\text{standard deviation (nm)}/\text{average secondary particle size (nm)}) \times 100 \quad (5)$$

(Calculation of Association Ratio)

An association ratio was calculated based on the measured average primary particle size and the average secondary particle size using the following Formula (6).

$$\text{Association ratio}=\text{average secondary particle size}/\text{average primary particle size} \quad (6)$$

(Measurement of Content of Silanol Groups on Surface)

An amount of the silica sol containing the silica particles obtained in Examples and Comparative Examples, corresponding to 1.5 g of the silica particles, was collected in a 200 mL tall beaker, and pure water was added thereto to adjust a liquid amount to 90 mL.

A pH electrode was inserted into a tall beaker under an environment of 25°, and a test solution was stirred for 5 minutes by a magnetic stirrer. While stirring with the magnetic stirrer was continued, a hydrochloric acid aqueous solution of 0.1 mol/L was added until a pH reached 3.6. The pH electrode was removed from the tall beaker, 30 g of sodium chloride was added in a state in which stirring with the magnetic stirrer was continued, and the sodium chloride was completely dissolved with gradually adding pure water. Pure water was added until a total amount of the test solution finally reached 150 mL, and the test solution was stirred for 5 minutes by the magnetic stirrer to obtain a test solution.

The tall beaker containing the obtained test solution was set in an automatic titration device "COM-1600" (manufactured by Hiranuma Sangyo Co., Ltd.), and the pH electrode and a burette attached to the device were inserted into the tall beaker. While the test solution was stirred with the magnetic stirrer, a sodium hydroxide aqueous solution of 0.1 mol/L was added dropwise through the burette, and a titration amount A (mL) of the sodium hydroxide aqueous solution of 0.1 mol/L required for the pH to be changed from 4.0 to 9.0 was measured.

A consumption amount V (mL) of the sodium hydroxide aqueous solution of 0.1 mol/L required for the pH to be changed from 4.0 to 9.0 per 1.5 g of the silica particles is calculated using the following Formula (1), and a content x (mass %) of the silanol groups on the surfaces of the silica particles is calculated using the following Formula (2).

$$V=(A \times f \times 100 \times 1.5)/(W \times C) \quad (1)$$

A: titration amount (mL) of sodium hydroxide aqueous solution of 0.1 mol/L required for pH to be changed from 4.0 to 9.0 per 1.5 g of silica particles f: titer of used sodium hydroxide aqueous solution of 0.1 mol/L C: concentration (mass %) of silica particles in silica sol W: collection amount (g) of silica sol $$x=(B \times 17/M) \times 100 \quad (2)$$

B: sodium hydroxide amount (mol) required for pH to be changed from 4.0 to 9.0 per 1.5 g of silica particles calculated based on V M: silica particle amount (1.5 g)

(Measurement of Content of Bulk Silanol Groups)

A silica sol obtained in each of Examples and Comparative Examples was freeze-dried to obtain a measurement sample. A nuclear magnetic resonance device (model name "Varian NMR Systems 400WB", manufactured by Varian Medical Systems, Inc.) of 400 MHz was used, a probe for CP/MAS having a diameter of 7.5 mm was mounted, and measurement was performed by a DD/MAS method with an observation nucleus of $^{29}$Si. As measurement conditions, a $^{29}$Si resonance frequency was 79.43 MHz, a $^{29}$Si90° pulse width was 5 μs, a $^1$H resonance frequency was 399.84 MHz, a $^1$H decoupling frequency was 50 kHz, an MAS rotation number is 4 kHz, a spectrum width was 30.49 kHz, and a measurement temperature was 23° C. In data analysis, for each peak of the spectrum after Fourier transform, optimization calculation was performed by a nonlinear least-squares method using a center position, a height, and a half value width of a peak shape created by mixing a Lorentz waveform and a Gaussian waveform as variable parameters. For four structural units Q1, Q2, Q3, and Q4, a content y (mass %) of the bulk silanol groups was calculated using the following Formula (3) based on a content of Q1, a content of Q2, a content of Q3, and a content of Q4, which have been obtained.

$$y=\{(\text{content of } Q3 \times 17 + \text{content of } Q2 \times 17 \times 2 + \text{content of } Q1 \times 17 \times 3)/(60 + \text{content of } Q3 \times 1 + \text{content of } Q2 \times 2 + \text{content of } Q1 \times 3)\} \times 100 \quad (3)$$

(Measurement of Content of Metal Impurity)

A silica sol containing 0.4 g of silica particles obtained in Comparative Example 1 was accurately weighed and sulfuric acid and hydrofluoric acid were added thereto. The mixture was heated, dissolved, and evaporated, and pure water was added to the remaining sulfuric acid droplets so that a total amount is accurately 10 g to prepare a test solution, followed by measuring a content of metal impurity using an inductively coupled plasma mass spectrometer "ELEMENT 2" (model name, manufactured by Thermo Fisher Scientific Inc.).

The content of the metal impurity in the silica particles was 1.1 ppm for sodium, 0.140 ppm for potassium, 0.015 ppm for iron, 0.135 ppm for aluminum, 0.075 ppm for calcium, 0.07 ppm for zinc, and less than 0.005 ppm for all of magnesium, cobalt, chromium, copper, manganese, lead, titanium, silver, and nickel.

From this, it is considered that the content of the metal impurity in each of the silica particles of Examples 1 to 3 and Comparative Examples 2 and 3 is 5 ppm or less.

(Storage Stability)

With respect to the silica particles obtained in Examples and Comparative Examples, after a lapse of one year from the purchase or production, the presence or absence of precipitation of the silica particles was confirmed with a naked eye, and the storage stability was evaluated.

When the precipitated silica particles were not observed with the naked eye, the storage stability was determined to be good and indicated by "A" in a table. When there are both of a case where precipitated silica particles are confirmed and a case where precipitated silica particles are not confirmed, it is determined that the storage stability is medium, and the result was shown as "B" in the table. A case where a large amount of silica particles settle out is indicated by "C" in the table as having no storage stability.

Comparative Example 1

Tetramethoxysilane and methanol were mixed at a volume ratio of 3:1 to prepare a raw material solution. A reaction solvent in which methanol, pure water, and ammonia were mixed in advance was charged into a reaction tank equipped with a thermometer, a stirrer, a supply pipe, and a distillation line. A concentration of water in the reaction solvent was 15 mass %, and a concentration of ammonia in the reaction solvent was 1 mass %.

With maintaining a temperature of the reaction solvent at 20° C., the reaction solvent and a raw material solution were set to 9.2:1 (volume ratio), and the raw material solution was added dropwise to the reaction tank for 25 minutes at a uniform rate to obtain a silica sol. The obtained silica sol was subjected to removal of methanol and ammonia by increasing the temperature with adjusting the liquid amount by adding pure water so that the content of silica particles was about 20 mass %, thereby obtaining a silica sol having a content of silica particles of about 20 mass %.

The evaluation results of the obtained silica particles are shown in Table 1.

Examples 1 to 3 and Comparative Example 2 and 3

A silica sol obtained in Comparative Example 1 was subjected to a pressurized heat treatment under conditions shown in Table 1 to obtain a silica sol having a content of silica particles of about 20 mass %.

The evaluation results of the silica particles contained in the obtained silica sol are shown in Table 1. In the table, "-" representing physical properties of particles of Comparative Examples 2 and 3 means that measurement was not possible due to significant particle aggregation.

Comparative Example 4

A commercially available silica sol (trade name "PL-3", manufactured by Fuso Chemical Co., Ltd.) was used as it was.

The evaluation results of the silica particles contained in the silica sol are shown in Table 1.

TABLE 1

| | Pressurized heat treatment conditions | | | | Physical characteristics of particles | | | | | | Evaluation result |
|---|---|---|---|---|---|---|---|---|---|---|---|
| | Temperature [° C.] | Pressure [MPa] | Time [hour] | pH | Proportion of silanol groups on surfaces (x/y) × 100 [%] | Content of silanol groups on surfaces (x) [mass %] | Content of bulk silanol groups (y) [mass %] | Average primary particle size [nm] | Average secondary particle size [nm] | cv (%) | Association ratio | Storage stability |
| Example 1 | 140 | 0.36 | 3 | 7.5 | 8.5 | 0.6 | 7.1 | 39.3 | 61.0 | 26.7 | 1.6 | A |
| Example 2 | 140 | 0.36 | 5 | 7.5 | 5.6 | 0.4 | 7.1 | 34.4 | 61.0 | 26.0 | 1.8 | A |
| Example 3 | 200 | 1.56 | 5 | 7.5 | 5.0 | 0.3 | 6.0 | 37.0 | 63.1 | 26.7 | 1.6 | A |
| Comparative Example 1 | — | — | — | — | 19.5 | 1.6 | 8.2 | 34.9 | 66.1 | 26.5 | 1.9 | A |
| Comparative Example 2 | 140 | 0.36 | 3 | 11.2 | — | — | — | — | — | — | — | C |
| Comparative Example 3 | 140 | 0.36 | 3 | 3.0 | — | — | — | — | — | — | — | C |
| Comparative Example 4 | — | — | — | — | 17.1 | 1.3 | 7.6 | 36.1 | 71.2 | 28.6 | 2.0 | B |

As can be seen from Table 1, in contrast to the silica particles in the silica sol obtained in Comparative Example 1 in which the pressurized heat treatment was not performed or Comparative Example 4 in which it is unknown whether the pressurized heat treatment was performed, the silica particles in the silica sol obtained in Examples 1 to 3 in which the pressurized heat treatment was performed had almost no change in an average primary particle size, an average secondary particle size, coefficient of variation (cv), and an association ratio, and a proportion of the silanol groups present on the surfaces were reduced. The reduction in the proportion of the silanol groups present on the surfaces in a situation where there is almost no change in the average primary particle size, the average secondary particle size, the cv, and the association ratio means that the formation of large membered rings is represented, and the formation of a membered rings by sharing oxygen of a $SiO_4$ tetrahedron are promoted, and the number of defects of the silica particles is small. This means that the number of four-membered rings is small, so that it is expected that the mechanical strength of the silica particles is excellent and the polishing characteristics of the polishing composition are excellent since the strain is small and elastic deformation is difficult. Since the pressurized heat treatment was performed, it is considered that a content of an alkoxy group or a silanol group was reduced, and it is expected that the number of reactive sites was small and the storage stability of the silica sol was excellent. Since the proportion of the surface silanol group was small, it is expected that the silica particles were stable and hardly precipitated.

In Comparative Example 2 in which the treatment was performed under alkaline conditions and Comparative Example 3 in which the treatment was performed under acidic conditions, although the pressure heat treatment was performed, the silica particles were significantly aggregated, and the proportion of the silanol groups present on the surfaces could not be measured.

In Comparative Example 4, which is a commercially available silica sol, there were observed a case where precipitation of silica particles occurred and a case where the precipitation of silica particles did not occur, and the storage stability was moderate.

In Comparative Example 1 in which the pressurized heat treatment was not performed, although the precipitated silica particles were not confirmed with the naked eye in the current evaluation, it is considered that a content of alkoxy groups or silanol groups is larger than those in Examples 1 to 3, and it is considered that the number of reactive sites is large, and the precipitation of the silica particles occurs in the case of further long-term storage.

Furthermore, in Comparative Examples 1 and 4, the proportion of the silanol groups on the surface was large. It is considered that, when the proportion of the surface silanol group is large, the formation of a large membered ring is not performed, the formation of a membered ring by sharing oxygen of a $SiO_4$ tetrahedron is not promoted, and the number of defects of the silica particles is large. Since this means that the number of four-membered rings is large, it is expected that the mechanical strength of the silica particles is inferior and the polishing characteristics of the polishing composition are inferior due to a large strain and easy elastic deformation.

Although the present invention has been described in detail with reference to the specific embodiments, it is obvious to those skilled in the art that various changes and modifications may be made without departing from the gist and the scope of the present invention. The present application is based on Japanese Patent Application No. 2019-029141 filed on Feb. 21, 2019, and the contents of which are incorporated herein by reference.

INDUSTRIAL APPLICABILITY

The silica particles according to the present invention, the silica particles obtained by the production method according to the present invention, the silica sol according to the present invention, and the polishing composition according to the present invention can be suitably used for polishing applications, for example, can be used for polishing of a semiconductor material such as a silicon wafer, polishing of an electronic material such as a hard disk substrate, polishing (chemical mechanical polishing) in a planarization step in manufacturing an integrated circuit, polishing of a synthetic quartz glass substrate used for a photomask or liquid crystal, polishing of a magnetic disk substrate, and the like, and among them, can be particularly suitably used for polishing or chemical mechanical polishing of a silicon wafer.

The invention claimed is:

1. A silica particle in which a proportion of silanol groups present on a surface represented by $(x/y) \times 100\%$ is 15% or less, where a content of the silanol groups on the surface measured by a Sears method is x mass %, and a content of bulk silanol groups measured by a solid $^{29}$Si-DD/MAS-NMR is y mass %.

2. The silica particle according to claim 1, wherein the proportion of the silanol groups present on the surface is 10% or less.

3. The silica particle according to claim 1, wherein the proportion of the silanol groups present on the surface is 1% or more.

4. The silica particle according to claim 2, wherein the proportion of the silanol groups present on the surface is 1% or more.

5. The silica particle according to claim 1, wherein an average primary particle size measured by a BET method is from 10 nm to 60 nm.

6. The silica particle according to claim 1, wherein an average secondary particle size measured by a DLS method is from 20 nm to 100 nm.

7. The silica particle according to claim 1, wherein a content of metal impurity is 5 ppm or less.

8. The silica particle according to claim 1, comprising 50 mass % or more a tetraalkoxysilane condensate, based on a total mass of components of the silica particle.

9. The silica particle according to claim 8, wherein the tetraalkoxysilane condensate includes a tetramethoxysilane condensate.

10. A method for producing a silica particle, comprising subjecting a silica particle to a pressurized heat treatment to obtain the silica particle according to claim 1.

11. A silica sol, comprising the silica particles according to claim 1.

12. The silica sol according to claim 11, wherein a content of the silica particles is 3 mass % to 50 mass % with respect to a total amount of the silica sol.

13. A polishing composition, comprising the silica sol according to claim 11.

14. A polishing method comprising polishing a substrate with the polishing composition according to claim 13.

15. A method for producing a semiconductor wafer, comprising polishing using the polishing composition according to claim 13.

16. A method for producing a semiconductor device, comprising a step of polishing using the polishing composition according to claim 13.

17. A silica particle according to claim 1, wherein the particle is made by a method comprising subjecting a silica particle to a pressurized heat treatment at a pressure from 0.1 MPa to 2.3 MPa, a temperature between 100° C. and 230° C. for a time of 0.25 hours to 4 hours, at a pH from 6.0 or more to 7.8 or less.

18. A silica particle according to claim 1, wherein the particle has a coefficient of variation, given by (a standard deviation of a dynamic light scattering particle size)/(the dynamic light scattering particle size)×100, of 15 or more and 50 or less.

* * * * *